United States Patent
Ku et al.

(10) Patent No.: US 9,442,134 B2
(45) Date of Patent: Sep. 13, 2016

(54) SIGNAL PATH SWITCH AND PROBE CARD HAVING THE SIGNAL PATH SWITCH

(71) Applicant: MPI CORPORATION, Zhubei (TW)

(72) Inventors: Wei-Cheng Ku, Zhubei (TW); Jun-Liang Lai, Zhubei (TW); Chun-Chung Huang, Taipei (TW); Wei Chen, Kaohsiung (TW); Hsin-Hsiang Liu, Guansi Township (TW); Kuang-Chung Chou, Taipei (TW)

(73) Assignee: MPI CORPORATION, Zhubei (TW)

( * ) Notice: Subject to any disclaimer, the term of this patent is extended or adjusted under 35 U.S.C. 154(b) by 71 days.

(21) Appl. No.: 14/332,047

(22) Filed: Jul. 15, 2014

(65) Prior Publication Data

US 2015/0015295 A1    Jan. 15, 2015

(30) Foreign Application Priority Data

Jul. 15, 2013 (TW) .............................. 102125233 A

(51) Int. Cl.
   *G01R 31/00* (2006.01)
   *G01R 1/073* (2006.01)
   *G01R 31/28* (2006.01)

(52) U.S. Cl.
   CPC ....... *G01R 1/07342* (2013.01); *G01R 31/2889* (2013.01)

(58) Field of Classification Search
   None
   See application file for complete search history.

(56) References Cited

U.S. PATENT DOCUMENTS

| | | | |
|---|---|---|---|
| 7,388,424 B2* | 6/2008 | Miller | G01R 31/31716 324/754.07 |
| 2007/0145989 A1* | 6/2007 | Zhu | G01R 1/06772 324/754.07 |
| 2008/0024148 A1* | 1/2008 | Tunaboylu | G01R 1/07378 324/756.03 |
| 2011/0089962 A1* | 4/2011 | Pagani | G01R 1/07 324/754.03 |

* cited by examiner

*Primary Examiner* — Minh N Tang
(74) *Attorney, Agent, or Firm* — Tracy M Heims; Apex Juris, Pllc

(57) ABSTRACT

A probe card, which is between a tester and a device under test (DUT), includes two first electrical lines, two second electrical lines, two inductive elements, and a capacitor. The first electrical lines are electrically connected to the probes respectively. The second electrical lines are electrically connected to the first electrical lines respectively. The inductive elements are electrically connected to the first electrical lines and the tester respectively; and the capacitor has opposite ends connected to the second electrical lines respectively.

9 Claims, 6 Drawing Sheets

SIGNAL PATH SWITCH AND PROBE CARD HAVING THE SIGNAL PATH SWITCH

BACKGROUND OF THE INVENTION

1. Technical Field

The present invention relates to a passive signal path switching device, and more particularly to a signal path switch and a probe card having the signal path switch.

2. Description of Related Art

A Probe cards are widely used in the testing of electrical connections between two electronic elements. In a test task, the probes contact the device under test (DUT) to transmit signals to a tester.

Because of improvements in digital technology, the speed and throughput of electronic devices is increasing day by day. As a result, the conventional tester, which generates the test signals having a frequency lower than the DUT, cannot process such high-frequency signals. To fix this problem, a modern tester makes the DUT generate high-frequency test signals and receives the test signals through the probe card and the DUT.

As shown in FIG. 1, a conventional probe card has a substrate 70, on which a relay 72 is provided. The relay 72 changes the signal path for the DC test signal of the tester 300 and the high-frequency test signal of the DUT 400. It is well known that the inductance in the line, through which the test signals transmit, is increasing while the line is longer. In other words, while the frequency of the test signal is getting higher, and the test signal has to travel from the DUT to the tester for a long path (for example the test signal travels through the probe 80, the substrate 70, another relay 72, the capacitor 74, another relay 72, the substrate 70, and another probe 80) that generates a large inductance while the test signal is travelling through the signal path. It results in a large resistance in the signal path and a large loss of signal when the test signal is travelling through the signal path. Therefore, the tester receives a weak test signal, and, sometime, results in an error test result. In addition, the relay 72 is active which means that the relay 72 has to be switched by user or by other devices that would not make a switch of the signal path in time and needs power to do the switch.

BRIEF SUMMARY OF THE INVENTION

In view of the above, the primary objective of the present invention is to provide a signal path switch and a probe card having the signal path switch, which provides a short signal path to reduce the resistance thereof and makes a switch of the signal paths in time and without any additional power.

The present invention provides a signal path switch having two first electrical lines, two second electrical lines, two inductive elements, and a capacitor, wherein the first electrical lines are electrically connected to the probes respectively; the second electrical lines are electrically connected to the first electrical lines respectively; the inductive elements are electrically connected to the first electrical lines and the tester respectively; and the capacitor has opposite ends connected to the second electrical lines respectively.

The present invention further provides a probe card, including a carrier board, two probes, and a signal path switch. The carrier board has a plurality of signal lines, each of which has an end connected to the tester. The probes are designated to contact the device under test. The signal path switch has two first electrical lines, two second electrical lines, two inductive elements, and a capacitor, wherein the first electrical lines are electrically connected to the probes respectively; the second electrical lines are electrically connected to the first electrical lines respectively; the inductive elements are electrically connected to the first electrical lines and the tester respectively; and the capacitor has opposite ends connected to the second electrical lines respectively.

Whereby, with the aforementioned design, it may shorten the signal path in high-frequency signal transmission to reduce the resistance accordingly. Furthermore, it may automatically switch to specific signal path according to the frequency of test signals without extra power.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 2:
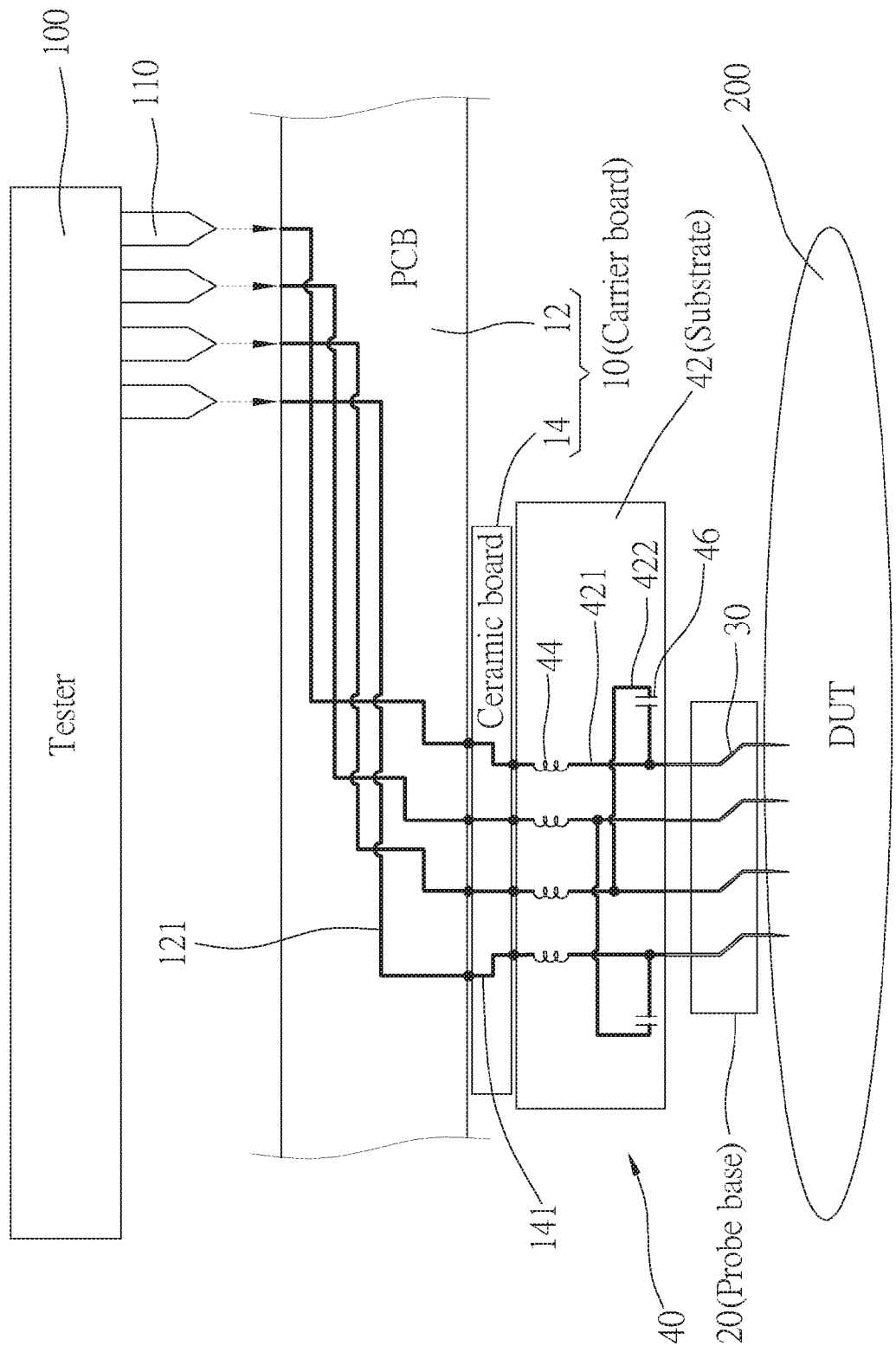
FIG. 2 is a sketch diagram of the probe card of a first preferred embodiment of the present invention.

FIG. 2 shows a probe card of the first preferred embodiment of the present invention, which is installed between a tester 100 and a device under test (DUT) 200. The probe card includes a carrier board 10, a probe base 20, four probes 30, and a signal path switch 40.

The carrier board 10 includes a printed circuit board (PCB) 12 and a multiplayer ceramic board 14. The PCB 12 has a plurality of signal lines 121 to connect test terminals 110 of the tester 100 respectively. Each of the signal lines 121 has a connecting pad on a bottom side of the PCB 12. The multiplayer ceramic board 14 is provided with conductors 141, each of which has a connecting pad on a top side of the multiplayer ceramic board 14 to be electrically connected to the connecting pads on the bottom side of the PCB 12 respectively. Each conductor 141 further has a connecting pad on a bottom side of the multiplayer ceramic board 14. An interval between the connecting pads on the bottom side of the multiplayer ceramic board 14 is shorter than that between the connecting pads on the top side of the multiplayer ceramic board 14.

The probe base 20 is above the DUT 200, and the probes 30 are embedded in the probe base 20. Each probe 30 has a tail end and a tip extending out of the probe base 20. The tips of the probes 30 are designated to contact the DUT 200.

The signal path switch 40 is between the carrier board 10 and the probe base 20. The signal path switch 40 includes a substrate 42, four inductive elements 44, and two capacitors 46. The substrate 42 is provided with a plurality of independent copper foils to form four first electrical lines 421 and four second electrical lines 422. The first electrical lines 421 each has a connecting pad on a bottom side of the substrate 42 to be electrically connected to the tail ends of the probes 30 respectively, and the second electrical lines 422 have ends electrically connected to first electrical lines 421 respectively. The inductive elements 44 are chokes in the present invention, and they could be coils, windings, beads, or other inductive devices instead. The inductive elements 44 are embedded in the substrate 42 with ends electrically connected to the first electrical lines 421, and form four connecting pads on a top side of the substrate 42 to contact the connecting pads on the bottom side of the multiplayer ceramic board 14 respectively. As a result, the inductive elements 44 are electrically connected to the signal lines 121 of the PCB 12 through the conductors 141 in the multiplayer ceramic board 14. The capacitors 46 are embedded in the substrate 42 as well, one of which has opposite ends electrically connected to two of the second electrical lines 421, and another one of which has opposite ends electrically connected to the rest two of the second electrical lines 421.

Figure 3:
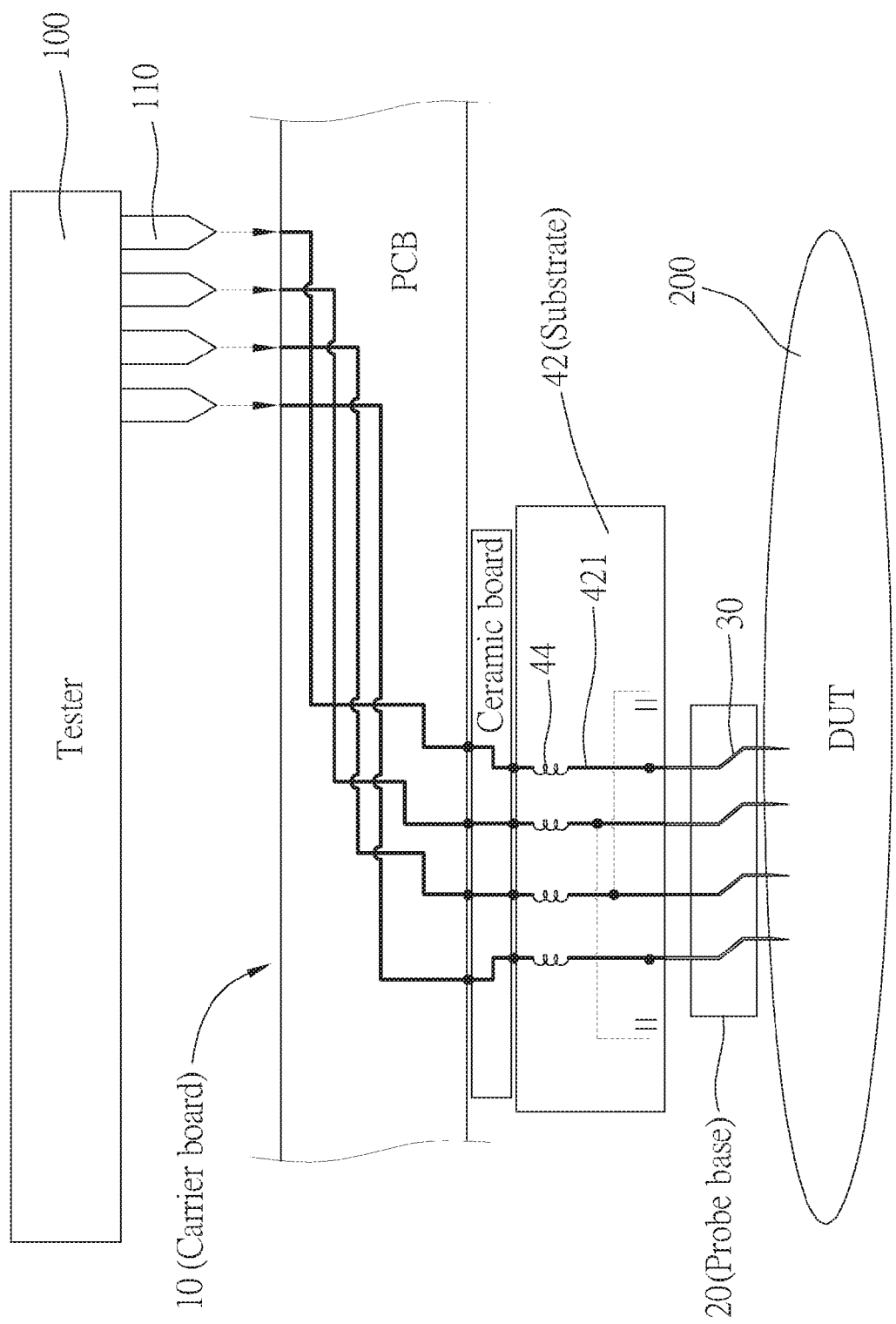
FIG. 3 is a sketch diagram of the probe card of the first preferred embodiment of the present invention, showing the signal path for the DC or low-frequency signals.

While the tester 100 outputs a DC or low-frequency test signal via one the test terminals 110, the inductive elements 44 generate a very small resistance, or become a short circuit, and the capacitors 46 generate a very large resistance, or become an open circuit. As shown in FIG. 3, the DC or low-frequency test signal of the tester 100 is transmitted to the DUT 200 through one of the test terminals 110, the carrier board 10, the inductive elements 44, the first electrical line 421, and one of the probes 30, and then the test signal is transmitted back to the tester 100 through another the probe 30, the first electrical line 421, the inductive elements 44, the carrier board 10, and another test terminal 110 to be tested in the tester 100.

Figure 4:
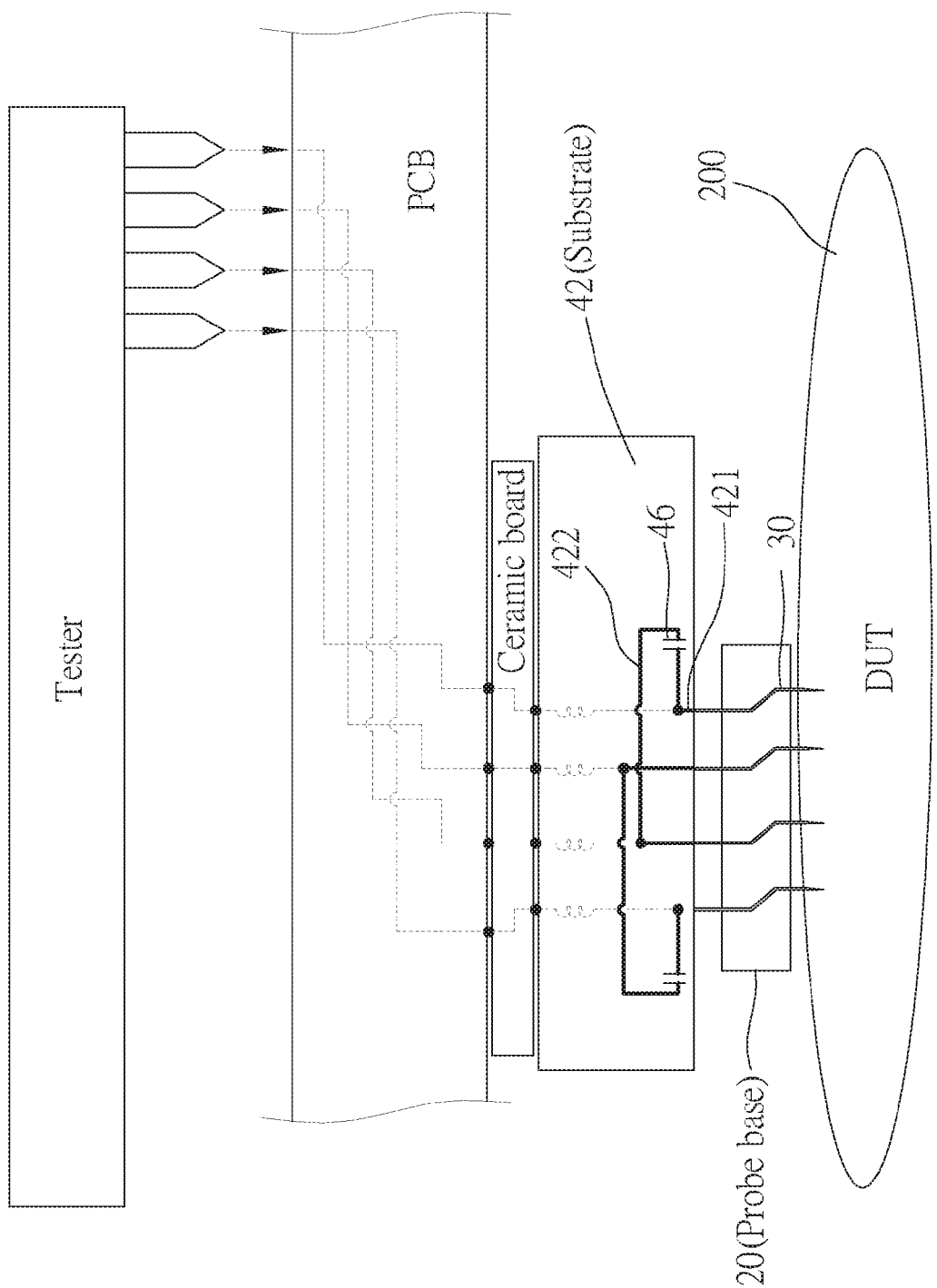
FIG. 4 is a sketch diagram of the probe card of the first preferred embodiment of the present invention, showing the signal path for the high-frequency signals.

While the tester 100 makes the DUT 200 output a high-frequency test signal for self-diagnosis, the inductive elements 44 generate a very large a resistance or become an open circuit, and the capacitors 46 generate a very small resistance or become a short circuit. As shown in FIG. 4, the high-frequency test signal from the DUT 200 is transmitted through one of the probes 30, the first electrical line 421, the second electrical line 422, the capacitors 46, another second electrical line 422 and first electrical line 421, and then back to the tester 100 via another probe 30 for self-diagnosis.

Figure 1:
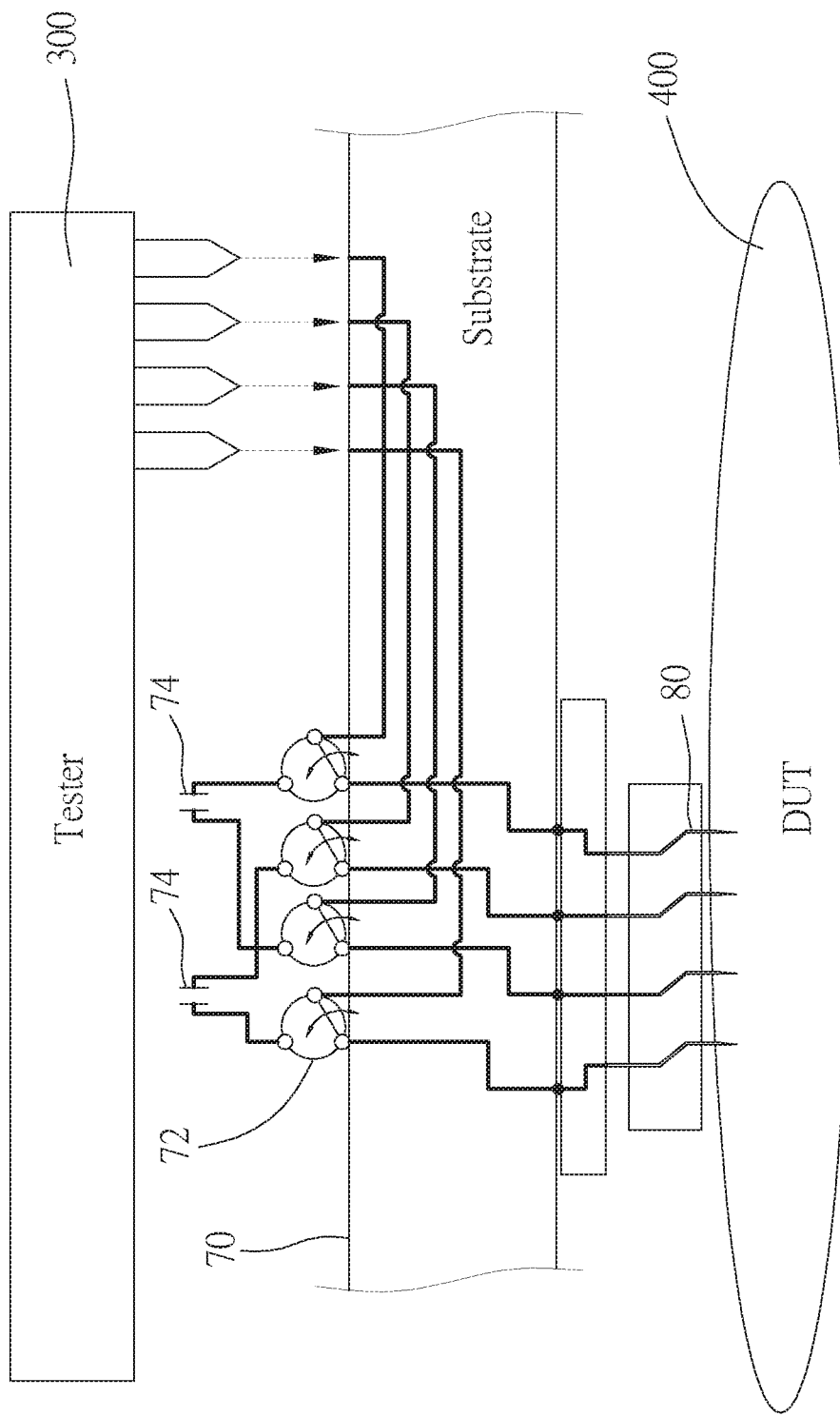
FIG. 1 is a sketch diagram of the conventional probe card.

As a result, the passive elements (such as the inductive elements 44 and the capacitors 46) will automatically change the resistances thereof according to the frequency of the test signal without extra power. In addition, the circuit of the present invention may reduce the distance of the signal path in high-frequency signal transmission to reduce the resistance accordingly. As a result, the high-frequency test signal of the DUT 200 could be tested precisely. Furthermore, the signal path switch 40 could be incorporated in the circuit of the conventional probe card, as shown in FIG. 1, between the substrate 70 and the probes 80 as well. With the inductive elements 44 and the capacitors 46, it may reduce a size of the signal path switch 40 to reduce the size of probe card.

Figure 5:
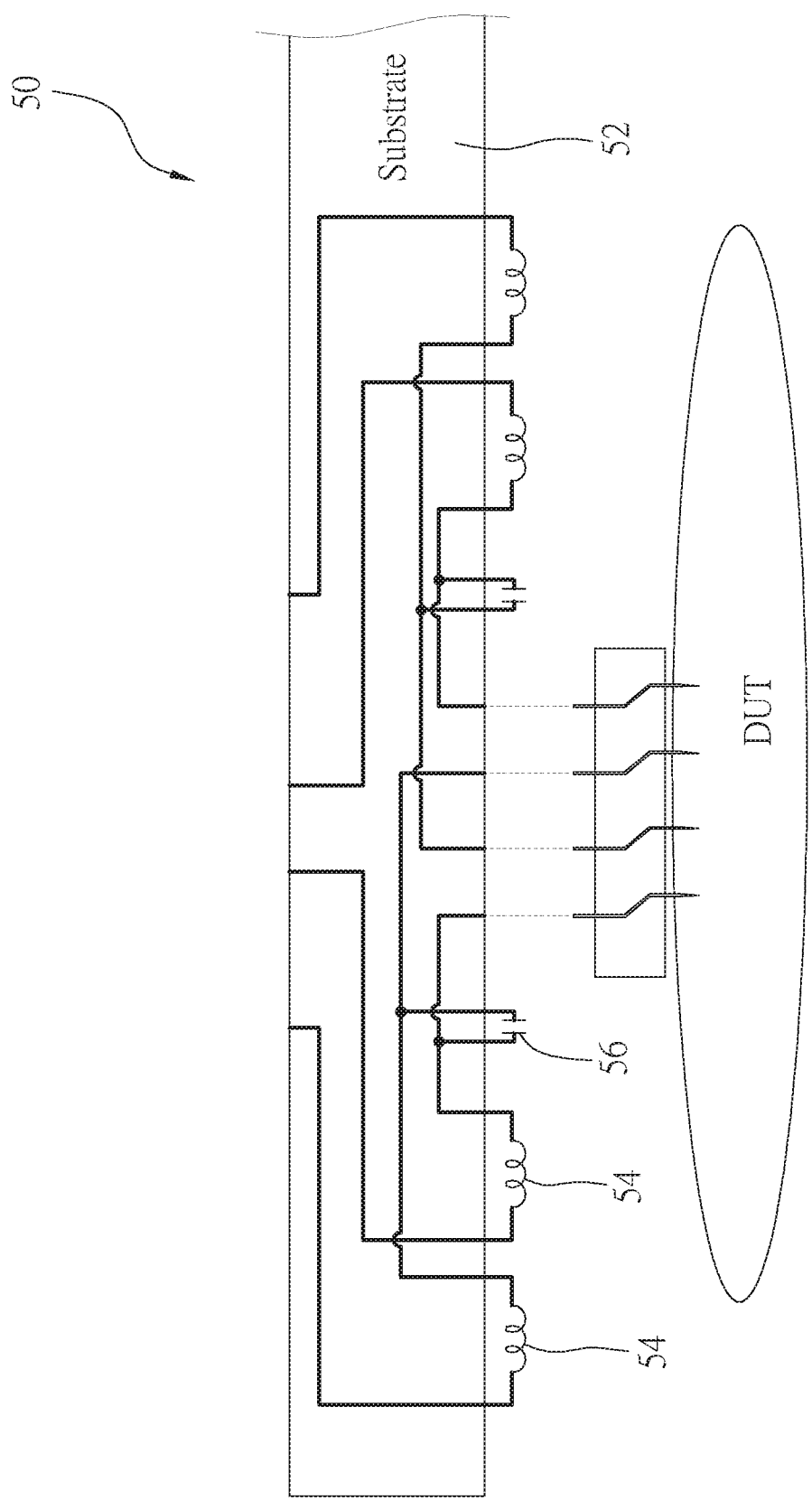
FIG. 5 is a sketch diagram of the signal path switch of a second preferred embodiment of the present invention.
Figure 6:
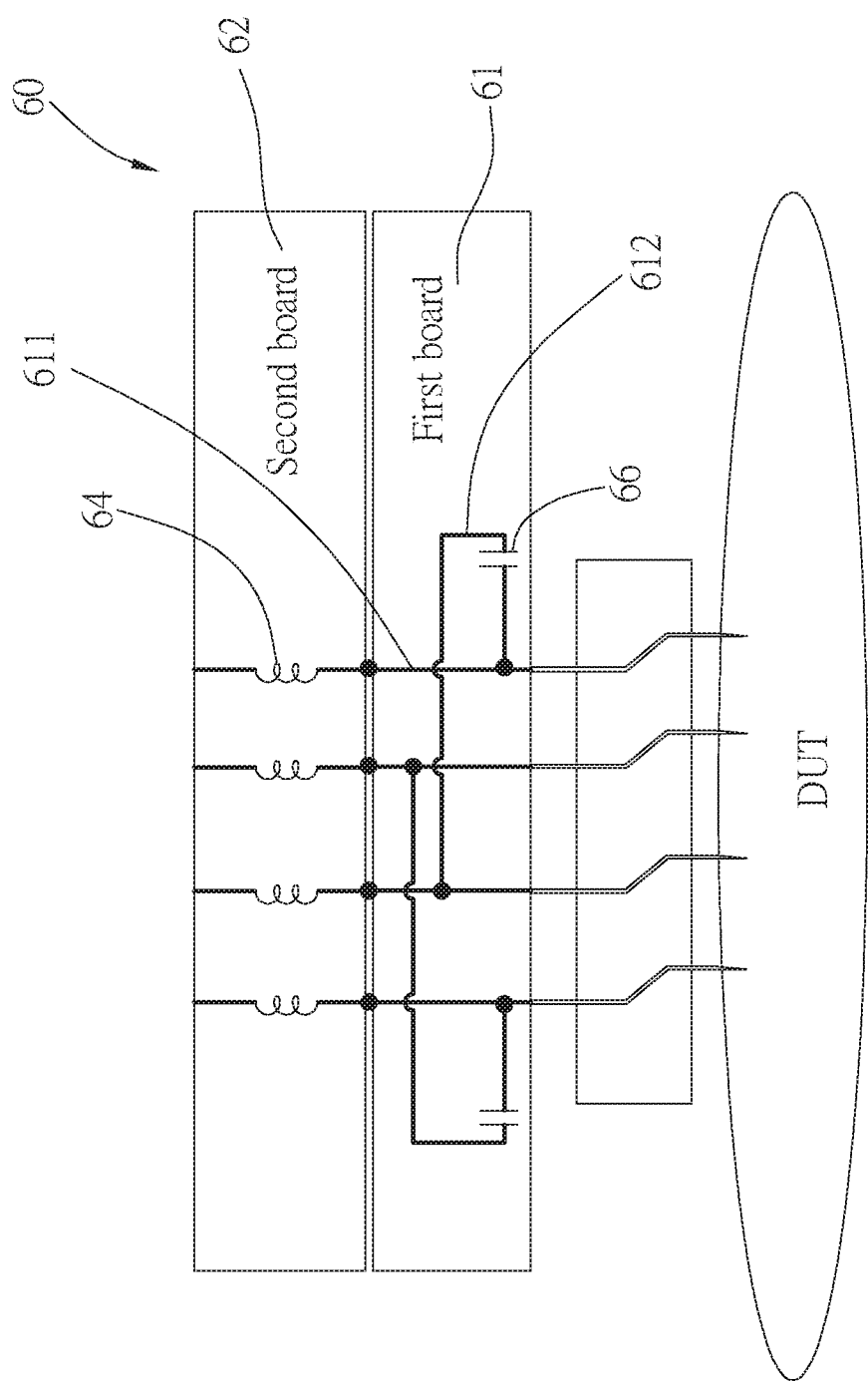
FIG. 6 is a sketch diagram of the signal path switch of a third preferred embodiment of the present invention.

FIG. 5 shows a signal path switch 50 of the second preferred embodiment of the present invention, in which inductive elements 54 and capacitors 56 are fixed on a surface of a substrate 52 by welding instead of embedded in the substrate that make the signal path switch 50 easier to be manufactured. FIG. 6 shows a signal path switch of the third preferred embodiment of the present invention, in which a substrate 60 includes a first board 61 and a second board 62. First electrical paths 611, second electrical paths 612, and capacitors 66 are embedded in the first board 61, and inductive elements 64 are embedded in the second board 62. The second board 62 is above the first board 61, and is connected to the first board 61 that achieve the same function as above. With the design of the third preferred embodiment of the present invention, when the inductive elements 64 and/or the capacitors 66 are damaged, it only needs to replace a new first board 61 and/or a new second board 62.

It must be pointed out that the embodiments described above are only some preferred embodiments of the present invention. The function of the multiplayer ceramic board (narrow the intervals between the connecting pads) could be incorporated in the signal path switch, so that no multiplayer ceramic board is found in the probe card. Furthermore, the signal path switch could be made into the carrier board directly that could reduce the size of the probe card. All equivalent structures which employ the concepts disclosed in this specification and the appended claims should fall within the scope of the present invention.

What is claimed is:

1. A signal path switch, which is provided between a tester and two probes, comprising:
   two first electrical lines electrically connected to the probes respectively;
   two second electrical lines electrically connected to the first electrical lines respectively;
   two inductive elements, each of which is electrically connected to each of the first electrical lines and the tester respectively; and
   a capacitor having opposite ends electrically connected to the second electrical lines respectively;
   wherein a high-frequency test signal is transmitted through one of the probes, one of the first electrical lines, one of the second electrical lines, the capacitor, the other second electrical line, the other first electrical line, and then back to the other probe.

2. The signal path switch of claim 1, further comprising a substrate, wherein the substrate is provided with the first electrical lines, the second electrical lines, the inductive elements, and the capacitor.

3. The signal path switch of claim 2, wherein the substrate has a first board and a second board; the first board is provided with the first electrical lines, the second electrical lines, and the capacitor, and the second board is provided with the inductive elements; the first board is connected to the second board.

4. The signal path switch of claim 2, wherein the inductive elements are embedded in the substrate.

5. The signal path switch of claim 2, wherein the capacitor is embedded in the substrate.

6. The signal path switch of claim 2, wherein the inductive elements are fixed to a surface of the substrate by welding.

7. The signal path switch of claim 2, wherein the capacitor is fixed to a surface of the substrate by welding.

8. A probe card, which is between a tester and a device under test, comprising:
   a carrier board having a plurality of signal lines, each of which has an end connected to the tester;
   two probes contacting the device under test; and
   a signal path switch having two first electrical lines, two second electrical lines, two inductive elements, and a capacitor, wherein the first electrical lines are electrically connected to the probes respectively; the second electrical lines are electrically connected to the first electrical lines respectively; the inductive elements are electrically connected to the first electrical lines and the tester respectively; and the capacitor has opposite ends connected to the second electrical lines respectively;

wherein a high-frequency test signal is transmitted through one of the probes, one of the first electrical lines, one of the second electrical lines, the capacitor, the other second electrical line, the other first electrical line, and then back to the other probe.

9. The probe card of claim 8, wherein the signal path switch further has a substrate, in which the first electrical lines and the second electrical lines are embedded, and the inductive elements and the capacitor are connected to the substrate.

* * * * *